(12) United States Patent
Hsu et al.

(10) Patent No.: US 10,516,027 B2
(45) Date of Patent: Dec. 24, 2019

(54) TRENCH POWER SEMICONDUCTOR AND METHOD OF MAKING THE SAME

(71) Applicant: SUPER GROUP SEMICONDUCTOR CO., LTD., Hsinchu County (TW)

(72) Inventors: Hsiu-Wen Hsu, Hsinchu County (TW); Chun-Ying Yeh, Hsinchu (TW); Yuan-Ming Lee, Taichung (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 0 days.

(21) Appl. No.: 15/990,719

(22) Filed: May 28, 2018

(65) Prior Publication Data

US 2019/0006479 A1 Jan. 3, 2019

(30) Foreign Application Priority Data

Jun. 30, 2017 (TW) .............................. 106122023 A

(51) Int. Cl.
| H01L 29/66 | (2006.01) |
| H01L 29/78 | (2006.01) |
| H01L 29/423 | (2006.01) |
| H01L 29/10 | (2006.01) |
| H01L 29/08 | (2006.01) |
| H01L 29/06 | (2006.01) |
| H01L 29/40 | (2006.01) |

(52) U.S. Cl.
CPC ...... *H01L 29/4236* (2013.01); *H01L 29/0649* (2013.01); *H01L 29/0847* (2013.01); *H01L 29/1095* (2013.01); *H01L 29/407* (2013.01); *H01L 29/42376* (2013.01); *H01L 29/66734* (2013.01); *H01L 29/7813* (2013.01)

(58) Field of Classification Search
CPC ............. H01L 29/4236; H01L 29/1095; H01L 29/7813; H01L 29/42376; H01L 29/66734; H01L 29/0649; H01L 29/407; H01L 29/0847
See application file for complete search history.

(56) References Cited

U.S. PATENT DOCUMENTS 7,476,589 B2* 1/2009 Grebs .................... H01L 29/407
438/270
7,936,009 B2* 5/2011 Pan ........................ H01L 29/407
257/330

(Continued)

*Primary Examiner* — Savitri Mulpuri
(74) *Attorney, Agent, or Firm* — Li & Cai Intellectual Property (USA) Office

(57) ABSTRACT

The present disclosure provides a trench power semiconductor component and a method of making the same. The trench power semiconductor component includes a substrate, an epitaxial layer, and a trench gate structure. The epitaxial layer is disposed on the substrate, the epitaxial layer having at least one trench formed therein. The trench gate structure is located in the at least one trench. The trench gate structure includes a bottom insulating layer covering a lower inner wall of the at least one trench, a shielding electrode located in the lower half part of the at least one trench, a gate electrode disposed on the shielding electrode, an inter-electrode dielectric layer disposed between the gate electrode and the shielding electrode, an upper insulating layer covering an upper inner wall of the at least one trench, and a protection structure including a first wall portion and a second side wall portion.

8 Claims, 18 Drawing Sheets

(56) References Cited

U.S. PATENT DOCUMENTS

| | | | | |
|---|---|---|---|---|
| 8,610,205 B2* | 12/2013 | Probst | .................... | H01L 29/401 |
| | | | | 257/333 |
| 8,642,425 B2* | 2/2014 | Burke | ............... | H01L 21/02164 |
| | | | | 438/259 |
| 9,252,239 B2* | 2/2016 | Yilmaz | ............. | H01L 29/66666 |
| 9,722,071 B1* | 8/2017 | Li | ........................ | H01L 29/7813 |
| 9,799,743 B1* | 10/2017 | Li | ...................... | H01L 21/02244 |
| 2009/0057754 A1* | 3/2009 | Kraft | ............... | H01L 21/823437 |
| | | | | 257/328 |
| 2009/0302480 A1* | 12/2009 | Birner | ............... | H01L 21/76898 |
| | | | | 257/774 |
| 2010/0123193 A1* | 5/2010 | Burke | ............. | H01L 21/823487 |
| | | | | 257/334 |

\* cited by examiner

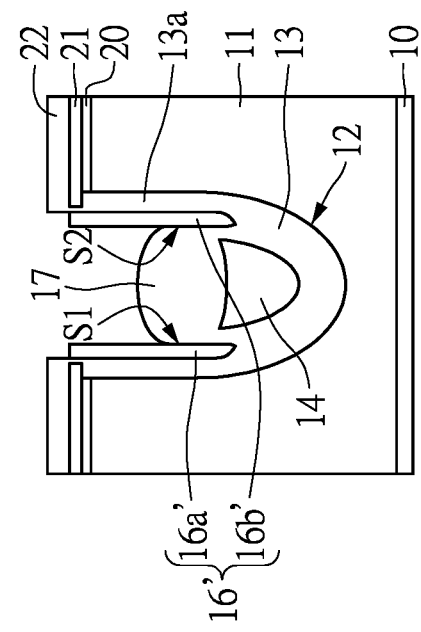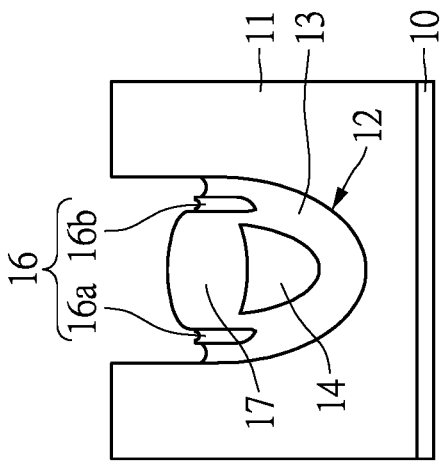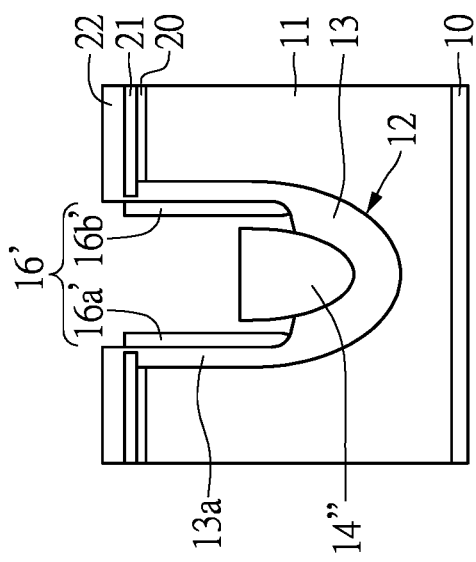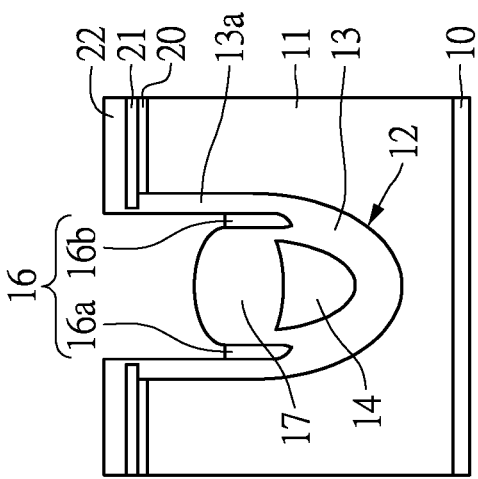

TRENCH POWER SEMICONDUCTOR AND METHOD OF MAKING THE SAME

BACKGROUND OF THE INVENTION

1. Field of the Invention

The present disclosure relates to a trench power semiconductor and a method of making the same; more particularly, to a trench power semiconductor component having a shielding electrode and a method of making the same.

2. Description of Related Art

Power loss in a conventional power metal oxide semiconductor field transistor (Power MOSFET) can be classified into two types, switching loss and conduction loss. Drain-to-gate capacitance is an important parameter in switching loss. A high drain-to-gate capacitance leads to the increase in switching loss, thereby limiting the switching rate of power MOSFETs. Therefore, a power MOSFET of high gate-to-drain capacitance is not suitable for high frequency circuits.

Power MOSFETs in the prior art include a shielding electrode located in the lower half part of the trench gate so as to reduce the gate-to-drain capacitance and increase the breakdown voltage without adversely affecting the on-resistance. In this way, the thickness of the epitaxial layer as well as the resistance value can be optimized.

However, the two side walls of the trench may be oxidized when performing a thermal oxidation process to form an inter-electrode dielectric layer that separates the shielding electrode and the gate electrode, which results in a deviation in the width of the trench from that originally designed.

SUMMARY OF THE INVENTION

Accordingly, the present disclosure provides a trench power semiconductor component and a method of making the same preventing the two side walls of the trench from being oxidized by forming a protection layer covering the shielding layer on the side wall surfaces before the inter-electrode dielectric layer is formed.

One embodiment of the present disclosure provides a trench power semiconductor component including a substrate, an epitaxial layer, and a trench gate structure. The epitaxial layer is disposed on the substrate, the epitaxial layer having at least one trench formed therein. The trench gate structure is located in the at least one trench. The trench gate structure includes a bottom insulating layer covering a lower inner wall of the at least one trench, a shielding electrode located in the lower half part of the at least one trench, a gate electrode disposed on the shielding electrode, an inter-electrode dielectric layer disposed between the gate electrode and the shielding electrode, an upper insulating layer covering an upper inner wall of the at least one trench, and a protection structure including a first wall portion and a second side wall portion. The shielding electrode and the epitaxial layer are separated from each other by the bottom insulating layer. The upper insulating layer, the bottom insulating layer, and the inter-electrode dielectric layer jointly define a first slit and a second slit, one located on either side of the inter-electrode dielectric layer. The first wall portion fills at least one portion of the first slit and the second side wall fills at least one portion of the second slit.

Another embodiment of the present disclosure provides a trend power semiconductor component including a substrate, an epitaxial layer disposed on the substrate, and a trench gate structure located in the at least one trench. The epitaxial layer has at least one trench formed therein. The trench gate structure includes a bottom insulating layer covering a lower inner wall of the at least one trench, a shielding electrode located in the lower half part of the at least one trench, a gate electrode disposed on the shielding electrode, an inter-electrode dielectric layer disposed between the gate electrode and the shielding electrode, and an upper insulating layer covering an upper inner wall of the at least one trench. The shielding electrode and the epitaxial layer are separated from each other by the bottom insulating layer. The upper insulating layer, the bottom insulating layer, and the inter-electrode dielectric layer jointly define a first slit and a second slit, one located on either side of the inter-electrode dielectric layer. The gate electrode includes a first extended portion and a second extended portion respectively located in the first slit and the second slit.

Yet another embodiment of the present disclosure provides a method of manufacturing a trench power semiconductor component. The method includes: forming a trench in the epitaxial layer; forming a trench gate structure in the trench; and forming a base region and a source region in the epitaxial layer, in which the source region is located above the base region. The step of forming the trench gate structure in the trench further includes: forming a bottom insulating layer covering a lower inner wall of the trench; forming a shielding electrode in the lower half part of the trench; forming an upper insulating layer covering two side walls of the trench opposite each other; forming a protection structure including a first wall portion and a second side wall portion and covering at least one portion of the upper insulating layer; forming an inter-electrode dielectric layer; and forming a gate electrode, in which the inter-electrode dielectric layer is located between the gate electrode and the shielding electrode. The upper insulating layer, the bottom insulating layer, and the inter-electrode dielectric layer jointly define a first slit and a second slit, one located on either side of the inter-electrode dielectric layer.

In summary, the trench power semiconductor component of the present disclosure forms a protection structure covering the two side walls of the trench before forming an inter-electrode dielectric layer, thereby preventing the two side walls of the trench from being oxidized during the formation of the inter-electrode dielectric layer, which changes the width of the trench.

For further understanding of the present disclosure, the following embodiments are provided along with illustrations to facilitate the disclosure of the present disclosure.

BRIEF DESCRIPTION OF THE DRAWINGS

FIGS. 10A to 10H are partial sectional schematic views illustrating each step of a process of making a trench power semiconductor component according to another embodiment of the present disclosure.

DETAILED DESCRIPTION OF THE PREFERRED EMBODIMENTS

The aforementioned illustrations and following detailed description are exemplary for the purpose of further explaining the scope of the present disclosure. Other objectives and advantages related to the present disclosure will be illustrated in the following description and appended drawings.

Figure 1:
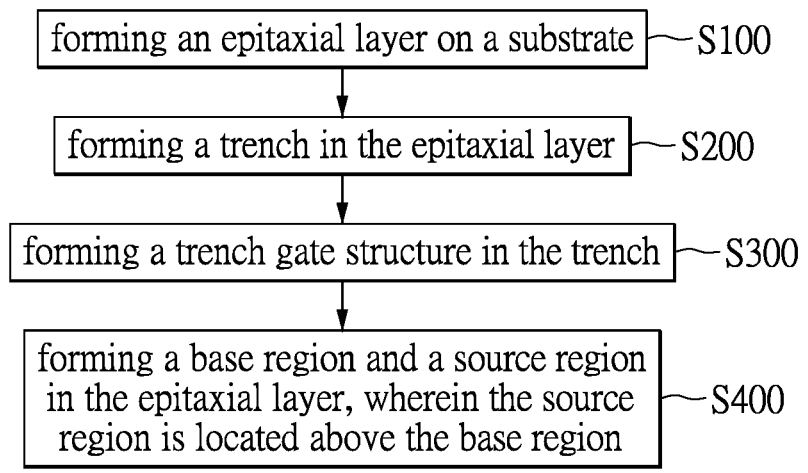
FIG. 1 is a flow chart illustrating a trench power semiconductor component according to an embodiment of the present disclosure.

With reference to FIG. 1, in which a flow chart illustrating a method of making a trench power semiconductor component according to an embodiment of the present disclosure is shown. The method of the present disclosure includes a step S100 of forming an epitaxial layer on a substrate; a step S200 of forming a trench in the epitaxial layer; a step S300 of forming a trench gate structure in the trench, and a step S400 of forming a base region and a source region in the epitaxial layer, in which the source region is located above the base region.

It should be noted that the step of forming a trench gate structure according to the present disclosure can be exemplified in many ways, in which a bottom insulating layer, a heavily doped semiconductor material located in the lower half part of the trench, and a protection structure are formed before forming an inter-electrode dielectric layer. Furthermore, the protection structure includes a first wall portion and a second side wall respectively covering two opposite side walls of the upper insulating layer. In the following description, various embodiments of the present disclosure are demonstrated so as to illustrate the method of making the trench power semiconductor component of the present disclosure and the steps of forming the trench gate structure.

Figure 2A:
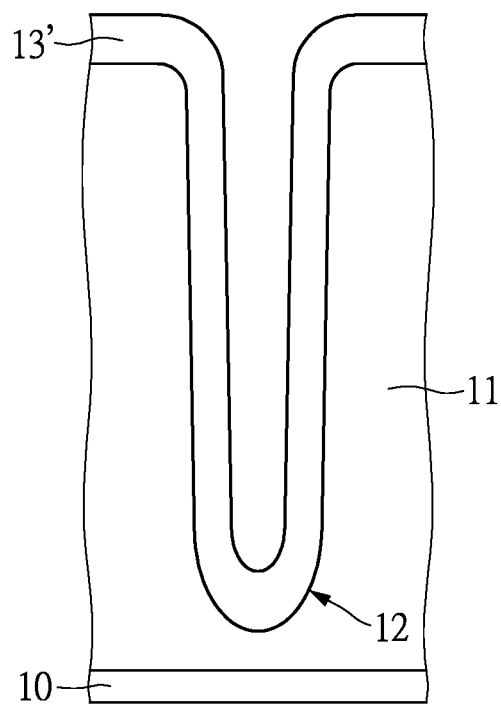
FIGS. 2A to 2K are partial sectional schematic views respectively illustrating each step of a process of making the trench power semiconductor component according to the embodiment of the present disclosure.

FIGS. 2A to 2K show each step of a process of making a trench power semiconductor component according to an embodiment of the present disclosure. Referring to FIG. 2A, an epitaxial layer 11 having the same conduction type as that of a substrate 10 is formed thereon, in which the doping concentration of the epitaxial layer 11 is lower than that of the substrate 10.

Moreover, a trench 12 is formed in the epitaxial layer 11 and then the step of forming the trench gate structure is performed. With reference to FIG. 2A, a first insulating layer 13' is formed on the inner wall surface of the trench 12, in which the first insulating layer 13' has an outline corresponding in shape with the inner wall surface of the trench 12. The step of forming the first insulating layer 13' can be done by performing a physical vapor deposition process, a chemical vapor deposition process or a thermal oxidation layer, and the first insulating layer 13' can be a silicon oxidation layer.

Figure 2B:
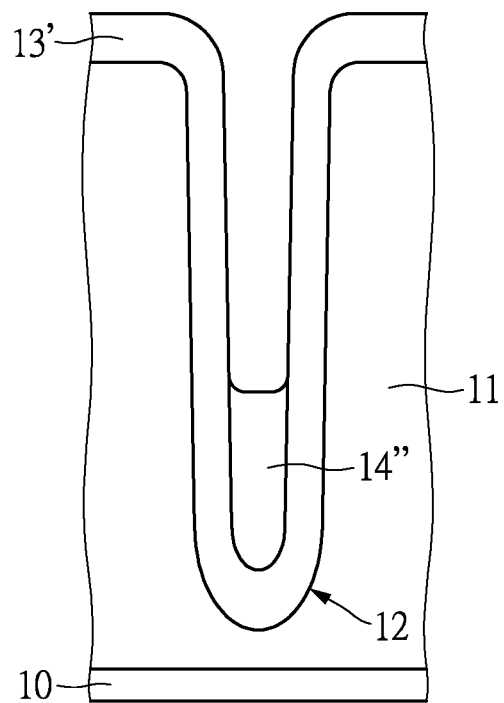

Next, referring to FIG. 2B, a heavily doped semiconductor material 14" is formed in the lower half part of the trench. In one embodiment, a polycrystalline silicon layer can first be formed covering the epitaxial layer 11 and the trench 12 disposed therein, and then the polycrystalline silicon layer is etched back, in which only the polycrystalline silicon layer in the lower half part of the trench 12 is left un-etched so as to form the heavily doped semiconductor material 14". The heavily doped semiconductor material 14" can be electrically conductive doped poly-Si.

Figure 2C:
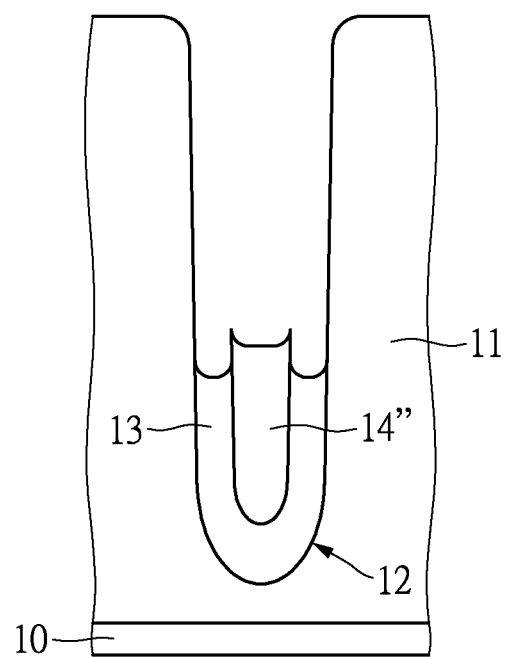

Next, with reference to FIG. 2C, the first insulating layer 13' in the upper half part of the trench 12 is removed so as to form the bottom insulating layer 13 in the lower half part of the trench 12. The bottom insulating layer 13 covers the lower inner wall surface of the trench 12. Moreover, the top portion of the heavily doped semiconductor material 14" protrudes from the top surface of the bottom insulating layer 13.

Figure 2D:
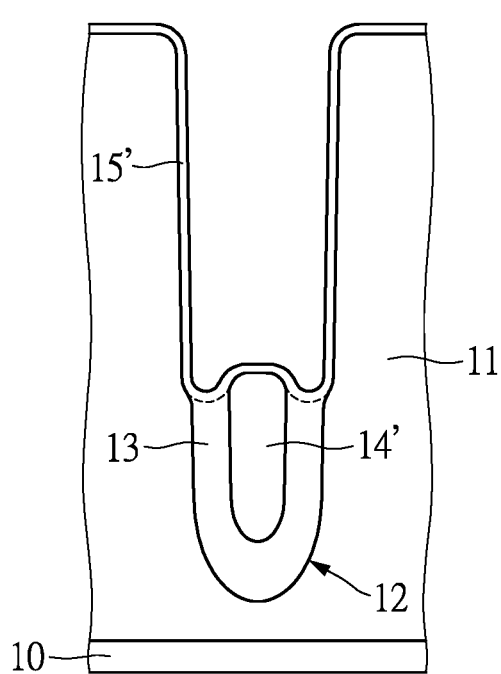

With reference to FIG. 2D, a second insulating layer 15' is formed. The second insulating layer 15' covers the upper inner wall surface of the trench 12, the bottom insulating layer 13 and the heavily doped semiconductor material 14'. In the present embodiment, the second insulating layer 15' is formed by oxidizing the top portion of the side wall of the trench 12 and that of the heavily doped semiconductor material 14". In this way, the width of the upper portion of the trench 12 is larger than that of the lower half part of the trench 12.

Figure 2E:
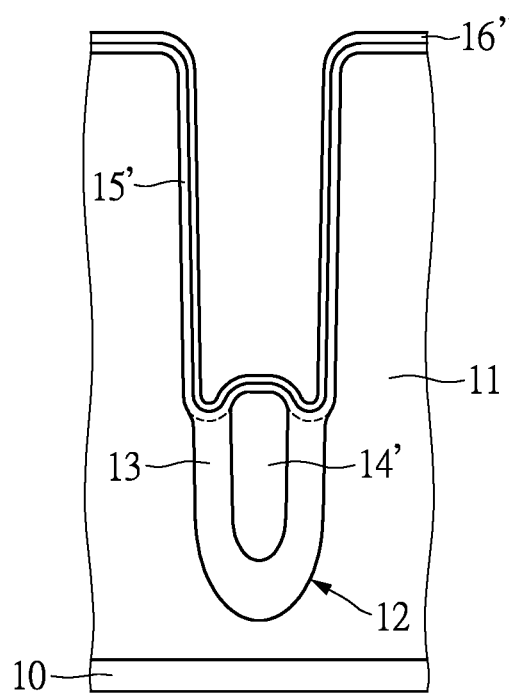

Further reference is made to FIG. 2E, a primary protection layer 16" is formed covering the second insulating layer 15'. The material of the primary protection layer 16" is different from that of the second insulating layer 15'. For example, the second insulating layer 15' is an oxide, and the primary protection layer 16" is a nitride, such as silicon nitride.

In the present embodiment, the thickness of the primary protection layer 16" on the surface of the epitaxial layer 11 is larger than that of the primary protection layer 16" on the heavily doped semiconductor material 14'. In addition, the primary protection layer 16" covering the side wall of the upper half part of the trench 12 has a thickness decreasing in a depth direction of the trench 12. However, in other embodiments, the thickness of every part of the primary protection layer 16" can be roughly uniform.

Figure 2F:
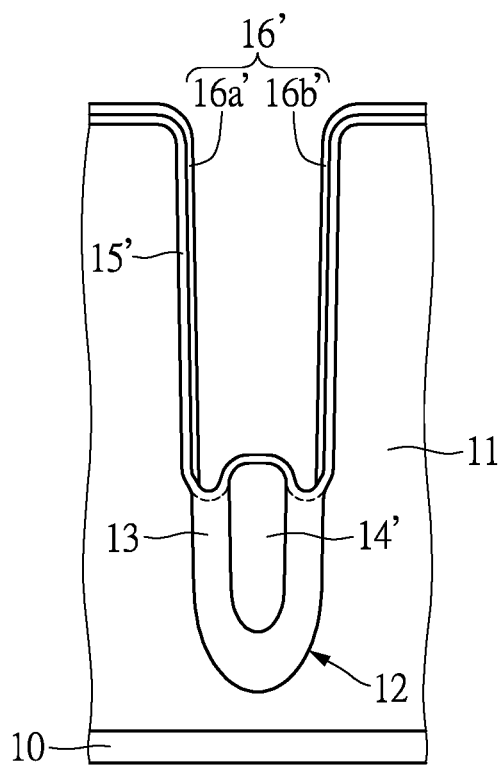

Next, referring to FIG. 2F, at least a part of the primary protection layer 16" covering the heavily doped semiconductor material 14' is removed so as to form the protection layer 16'. In the present embodiment, the removal of a part of the primary protection layer 16" is completed by a dry etching process. It should be noted that, the primary protection layer 16" on the epitaxial layer 11 will not be completely removed by the dry etching process since the thickness of the primary protection layer 16" on the epitaxial layer 11 is larger than the primary protection layer 16" in the trench 12.

Figure 2G:
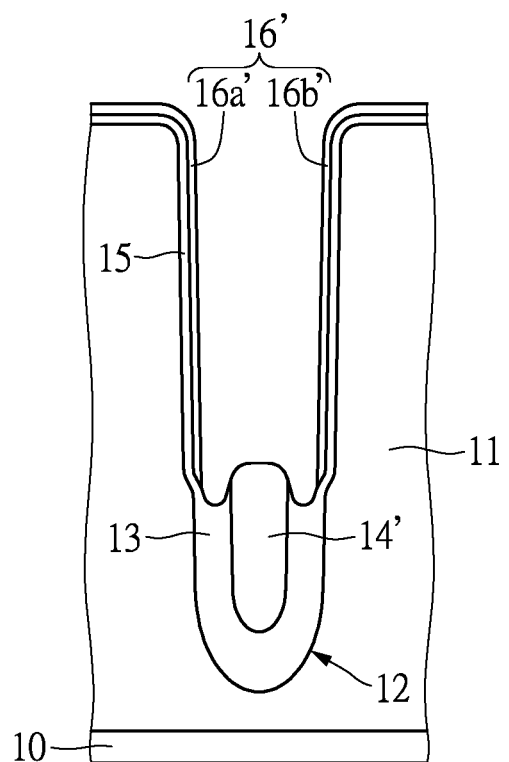

Referring to FIG. 2G, in the present embodiment, the second insulating layer 15' covering the bottom insulating layer 13 and the heavily doped semiconductor material 14' is removed so as to expose the top of the heavily doped semiconductor material 14'. Furthermore, the part of the second insulating layer 15' left unremoved forms the upper insulating layer 15.

Consequently, the protection layer 16' includes at least a first wall portion 16a' and a second wall portion 16b' respectively cover two opposite inner side walls of the upper insulating layer 15. With reference to FIG. 2G, the lower end of the first wall portion 16a' and that of the second wall portion 16b' are as higher than or at the same level as the top end of the heavily doped semiconductor material 14'. The thickness of the first wall portion 16a' and that of the second wall portion 16b' decrease downwardly along the depth direction of the trench 12.

Figure 2H:
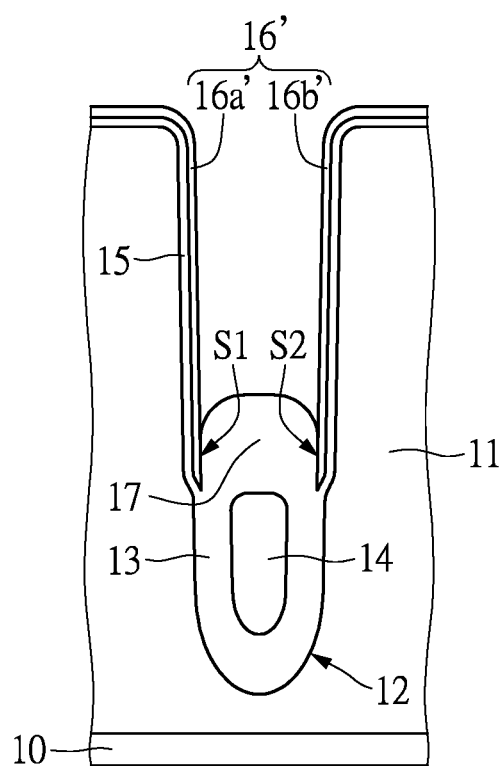

Referring to FIG. 2H, an inter-electrode dielectric layer 17 is formed by performing a thermal oxidation process to oxidize the top portion of the heavily doped semiconductor material 14'. Furthermore, the part of the shielding electrode 14 that is left un-oxidized forms the shielding electrode 14. Since a protection layer 16' protecting the two side walls of the trench 12 has already been formed before the step of forming the inter-electrode dielectric layer 17, a change in the width of the trench 12 resulted from the oxidation of the two side walls of the trench 12 when performing the thermal oxidation process can be avoided.

In addition, referring to FIG. 2H, the upper insulating layer 15, the bottom insulating layer 13, and the inter-electrode dielectric layer 17 jointly define a first slot S1 and a second slot S2 on either side of the inter-electrode dielectric layer 17, in which lower part of the first wall portion 16a' fills the first slot S1 and the lower part of the second wall portion 16b' fills the second slot S2. A cross section of the first slot S1 and that of the second slot S2 are both in a hook shape.

Figure 2I:
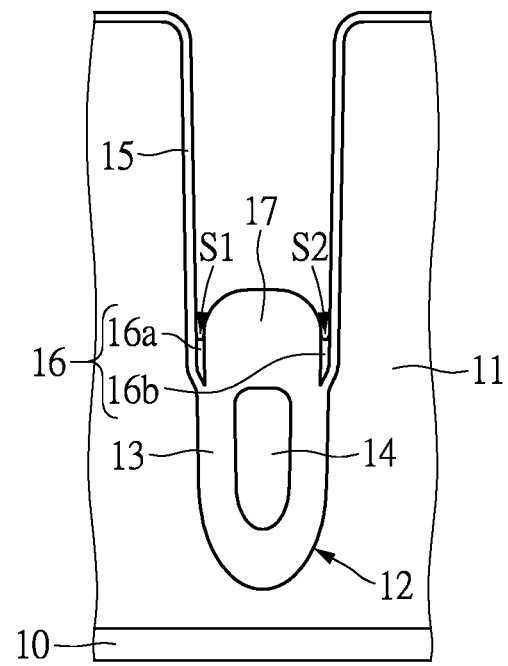

Moreover, with reference to FIG. 2I, a part of the first wall portion 16a' and a part of the second wall portion 16b' are removed. The remaining part of the first wall portion 16a fills a part of the first slot S1 and the remaining part of the second wall portion 16b fills a part of the second slot S2. In this way, in this embodiment, a sectional outline of the first wall portion 16a and that of the second wall portion 16b are both in a hook shape.

Figure 2J:
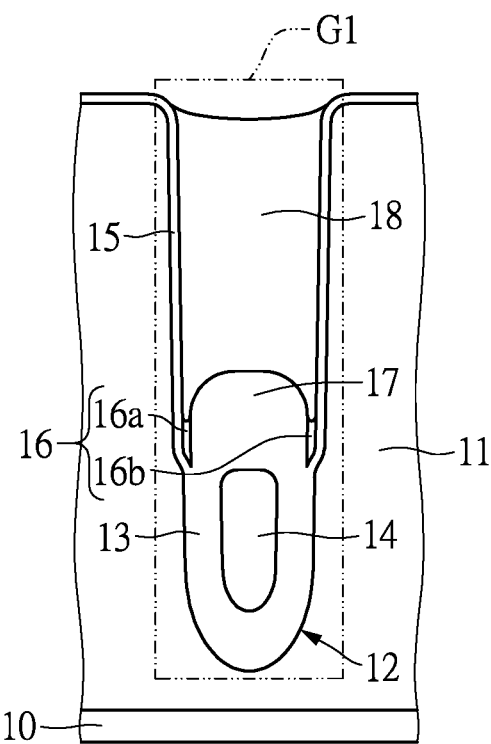

Referring to FIG. 2J, a gate electrode 18 is formed in the upper portion of the trench 12, in which the gate electrode 18 is separated from the shielding electrode 14 by the inter-electrode dielectric layer 17. When forming the polycrystalline silicon material, the polycrystalline silicon material fills the first slot S1 and the second slot S2.

Figure 2K:
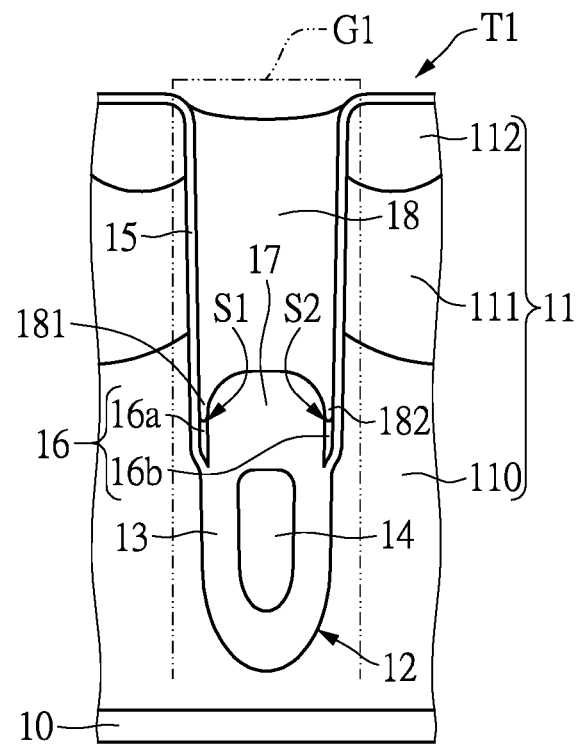

With reference to FIG. 2K, a base region 111 and a source region 112 are subsequently formed in the epitaxial layer 11, in which the source region 112 is located above the base region 111. Furthermore, the part of the epitaxial layer 11 that is un-doped, that is to say, the part of the epitaxial layer 11 beneath the base region 111, is defined as a drift region 110 of the trench power semiconductor component T1.

The gate electrode 18 of the present embodiment includes a first extension portion 181 inside the first slot S1 and a second extension portion 182 inside the second slot S2. The first wall portion 16a and the first extension portion 181 are both situated in the first slot S1, and the second wall portion 16b together with the second extension portion 182 are situated in the second slot S2.

Figure 3A:
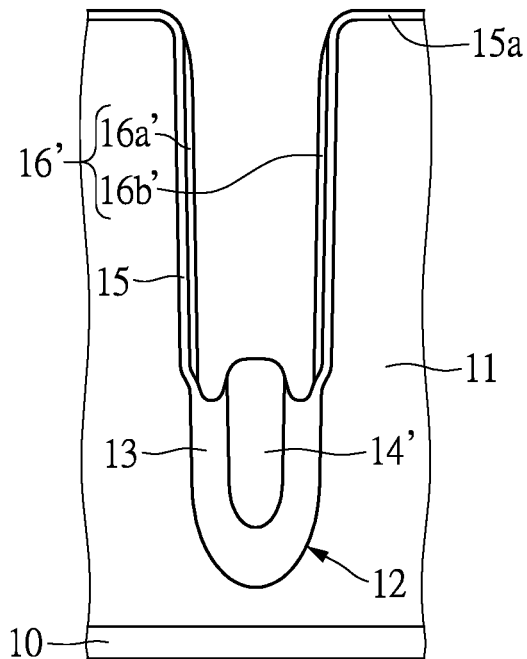
FIGS. 3A to 3C are partial sectional schematic views respectively illustrating each step of a process of making a trench power semiconductor component according to another embodiment of the present disclosure.
Figure 3B:
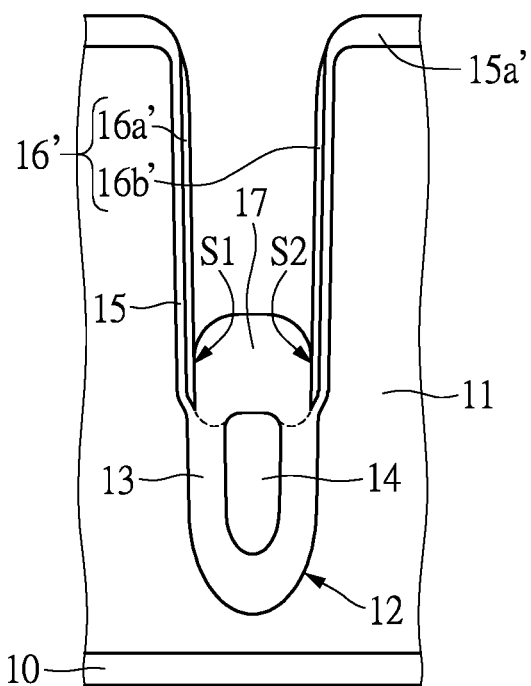
Figure 3C:
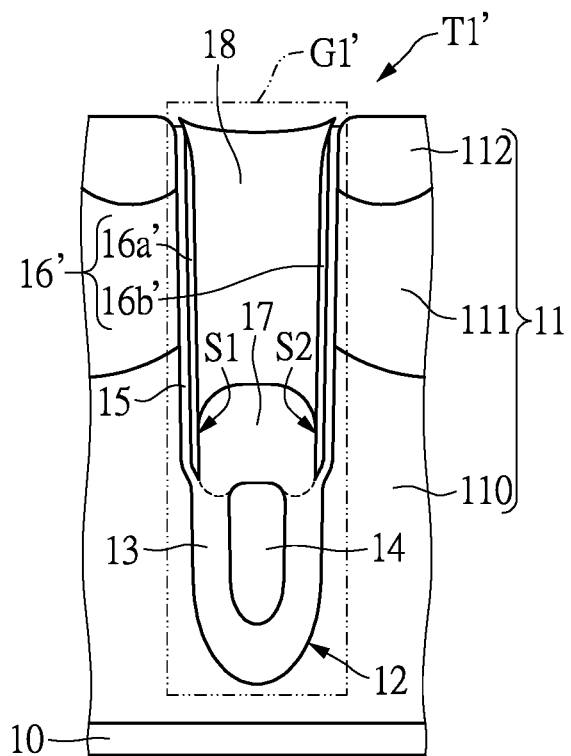

With reference to FIGS. 3A to 3C, in which partial sectional schematic views of each step of the manufacturing process of making a trench power semiconductor component according to another embodiment of the present disclosure are shown. FIGS. 3A to 3C illustrate the steps following the step shown in FIG. 2D.

In the embodiment shown in FIG. 3A, the primary protection layer 16" on the epitaxial layer 11 is simultaneously removed when removing a part of the primary protection layer 16" covering the heavily doped semiconductor material 14'. The part of the second insulating layer 15' covering the upper inner wall surface of the trench 12 is the upper insulating layer 15, and the part of the second insulating layer 15' covering the surface of the epitaxial layer 11 is a surface oxide layer 15a.

In one embodiment, the dry etching process allows only downward etching and not lateral etching. Consequently, when removing the protection layer 16' on the epitaxial layer 11 and covering the heavily doped semiconductor material 14', the part of the primary protection layer 16" on the two inner side walls of the upper insulating layer 15 can remain un-etched, thereby forming the first wall portion 16a' and the second wall portion 16b' and exposing the top of the heavily doped semiconductor material 14'.

With reference to FIG. 3B, a thermal oxidation process is next performed so as to oxidize the top portion of the heavily doped semiconductor material 14' and thereby form the inter-electrode dielectric layer 17. Furthermore, the part of the heavily doped semiconductor material 14' that is not oxidized forms the shielding electrode 14. Since the part of the primary protection layer 16" on the epitaxial layer 11 has been removed, the second insulating layer 15' exposed on the epitaxial layer 11 is also oxidized. Therefore, the thickness of the surface oxide layer 15a' is increased.

Further reference is made to FIG. 3C, a gate electrode 18 is formed in the trench 12 above the shielding electrode 14 such that a trench gate structure G1' is formed. In the present embodiment, the first wall portion 16a' and the second wall portion 16b' in the upper half part of the trench 12 remain un-etched. That is to say, the first wall portion 16a' extends from the opening end of the trench 12 into the first slot S1, and the second wall portion 16b' extends from the opening end of the trench 12 into the second slot S2. In this way, the first wall portion 16a', the second wall portion 16b' together with the upper insulating layer 15 serve as an insulating layer separating the gate electrode 18 from the epitaxial layer 11.

Next, a base region 111 and a source region 112 are formed in the epitaxial layer 11 so as to form the trench power semiconductor component T1' shown in FIG. 3C. In the present embodiment, the surface oxide layer 15a' on the epitaxial layer 11 will be thinned or removed completely so as to facilitate the base region doping process and the source region doping process that are to be performed subsequently.

Figure 4A:
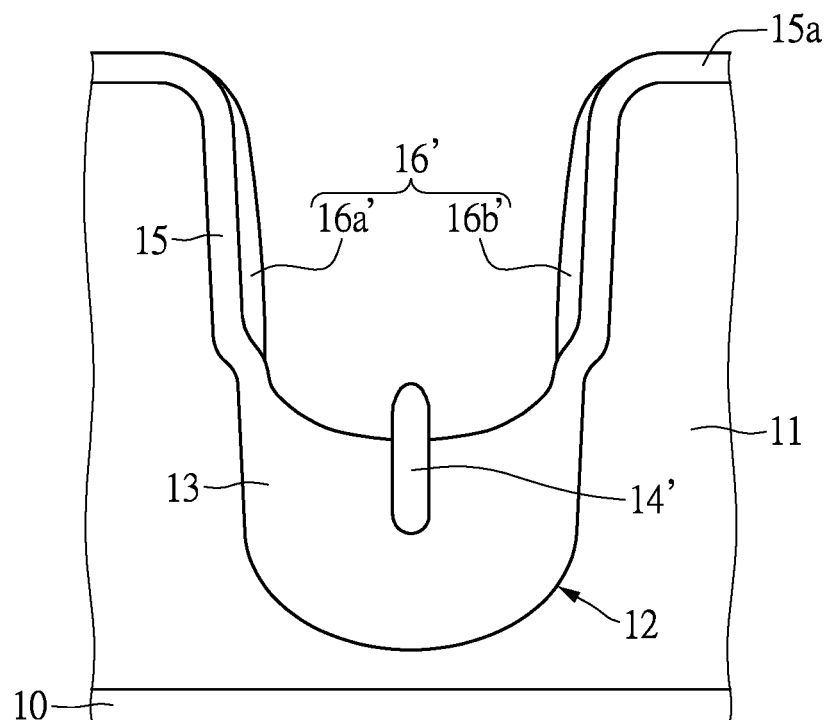
FIGS. 4A to 4C are partial sectional schematic views respectively illustrating each step of a process of making a trench power semiconductor component according to another embodiment of the present disclosure.
Figure 4B:
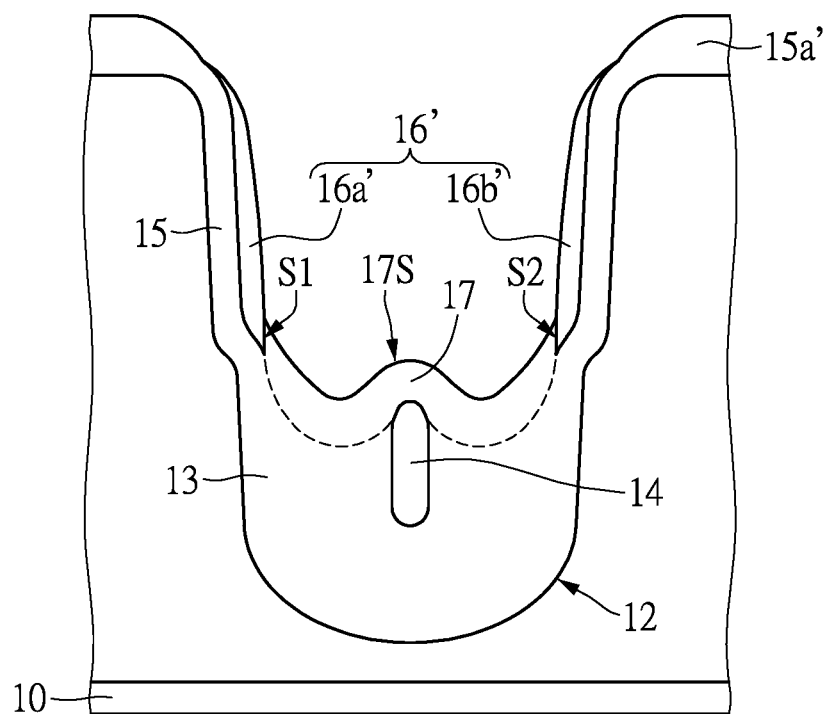
Figure 4C:
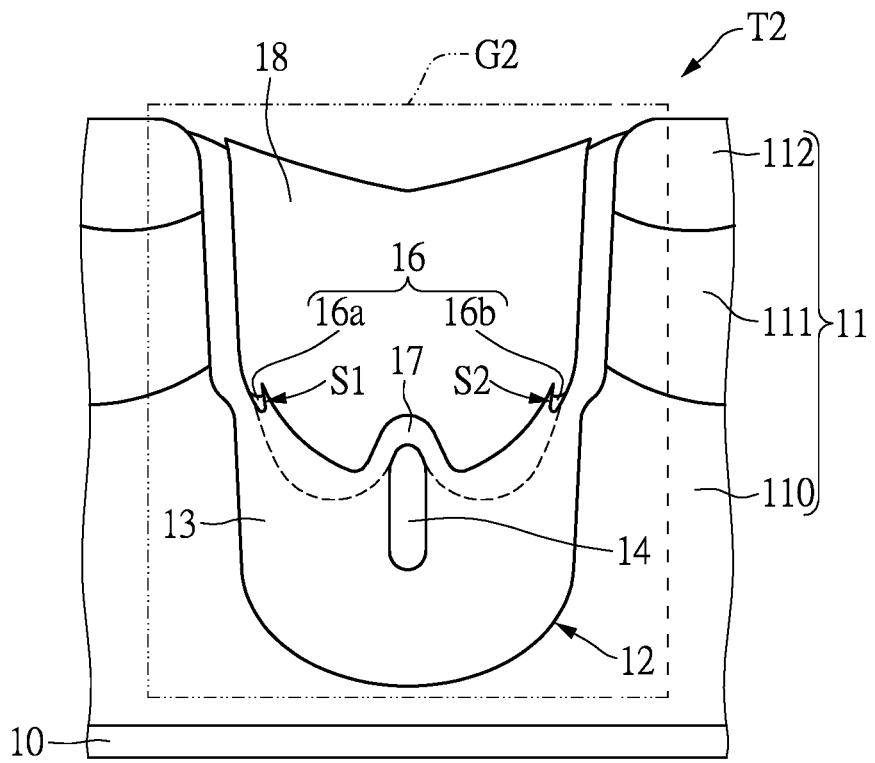

With reference to FIGS. 4A to 4C, in which partial sectional schematic views illustrating each step of a process of making a trench power semiconductor component according to another embodiment of the present disclosure are shown. The steps illustrated in FIGS. 4A to 4C are basically similar to that in FIGS. 3A to 3C except that the trench power semiconductor component T2 of the present embodiment has a larger width.

Referring to FIG. 4A, a protection layer 16' is formed in the trench 12 with the first wall portion 16a' and the second wall portion 16b' thereof covering the two opposite side walls of the upper insulating layer 15 respectively. Moreover, the top portion of the heavily doped semiconductor material 14' protrudes from the top surface of the bottom insulating layer 13. Furthermore, the part of the second insulating layer 15' covering the upper inner wall surface of the trench 12 is the upper insulating layer 15, and that covering the epitaxial layer 11 is a surface oxide layer 15a.

With reference to FIG. 4B, a thermal oxidation process is then performed so as to oxidize the top portion of the heavily doped semiconductor material 14', thereby forming the inter-electrode dielectric layer 17. In the present embodiment, the top surface of the inter-electrode dielectric layer 17 has a mountain-shaped curve, whose peak is located right above the shielding electrode 14. Similarly, the upper insulating layer 15, the inter-electrode dielectric layer 17 and the bottom insulating layer 13 jointly define a first slot S1 and a second slot S2, one on either side of the inter-electrode dielectric layer 17.

Next, referring to FIG. 4C, the first wall portion 16a' and the second wall portion 16b' are removed, and a gate electrode 18 is formed in the trench 12 so as to form the trench gate structure G2. Afterwards, a base region 111, a source region 112, and a redistribution layer are formed respectively so as to form the trench power semiconductor component T2 of the present embodiment.

In the present embodiment, the first wall portion 16a and a portion of the gate electrode 18 fill the first slot S1, and the second wall portion 16b and another portion of the gate electrode 18 fill the second slot S2. Furthermore, since the trench 12 of the present embodiment has a larger width, the bottom surface of the trench 12 has a larger radius of curvature, which decreases the distribution density of the electric field at the bottom of the trench 12. Through the technical solution mentioned above, the trench power semiconductor component T2 of the present embodiment can withstand a higher voltage, which ranges approximately from 60 V to 250 V.

Figure 5:
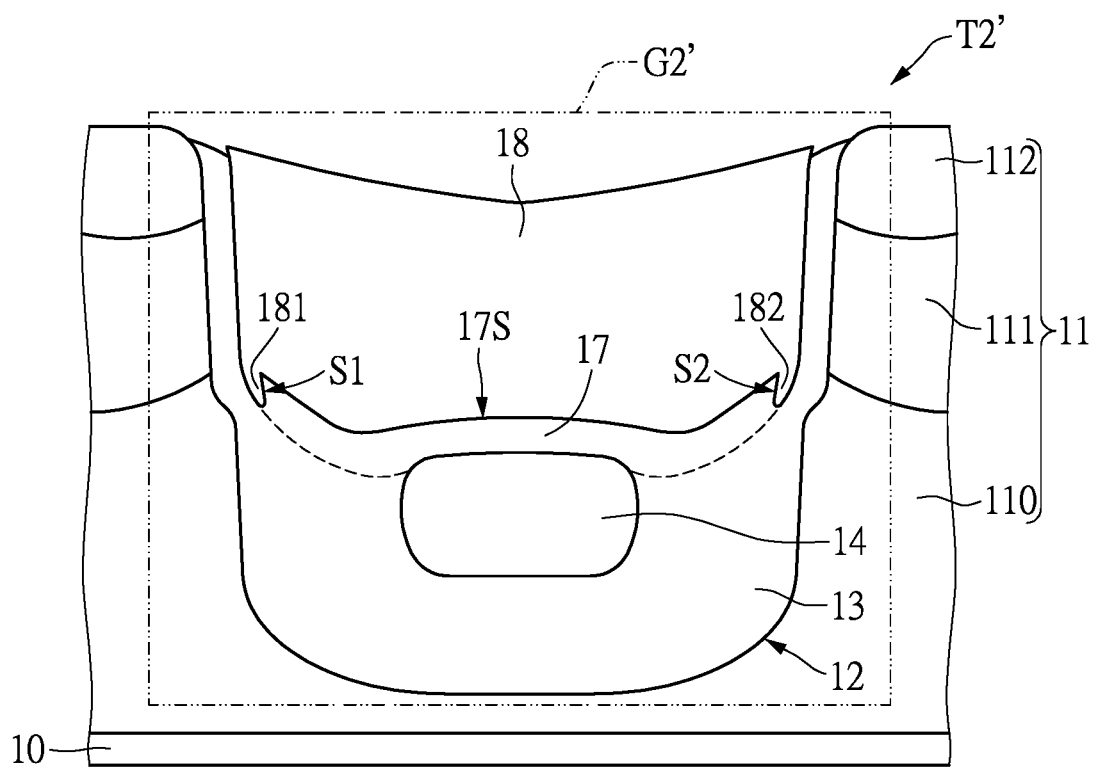
FIG. 5 is a partial sectional schematic view illustrating a trench power semiconductor component according to another embodiment of the present disclosure.

Referring to FIG. 5, in which a partial sectional schematic view illustrating a trench power semiconductor component according to another embodiment of the present disclosure is shown.

The trench power semiconductor component T2' of FIG. 5 has a shielding electrode 14 of a larger width, which contributes to a smaller gate-to-drain capacitance. In the embodiment shown in FIG. 5, the top surface of the inter-electrode dielectric layer 17 has a mountain-shaped curve 17S, the peak of which is located right above the shielding electrode 14.

Furthermore, the difference between the trench power semiconductor component T2 of FIG. 4C and the trench power semiconductor component T2' of FIG. 5 is that the trench gate structure G2' of the trench power semiconductor component T2' has a first slot S1 and a second slot S2 respectively having a wider opening. Therefore, the first wall portion 16a' and the second wall portion 16b' of the protection layer 16' can be completely removed before the step of forming the gate electrode 18, during which the first slot S1 and the second slot S2 are filled up by the gate electrode 18.

More specifically, in the present embodiment, the gate electrode 18 has a first extension portion 181 and a second extension portion 182, in which the first slot S1 is completely filled up by the first extension portion 181 and the second slot S2 is completely filled up by the second slot S2.

Figure 6A:
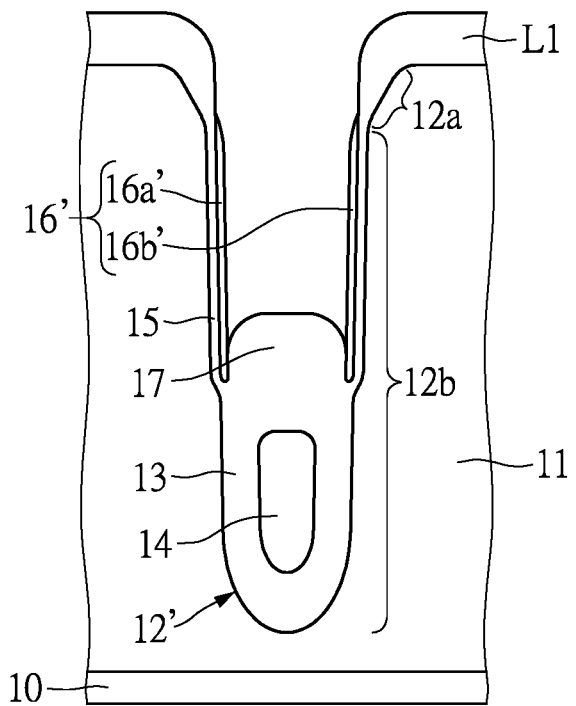
FIGS. 6A and 6B are partial sectional schematic views respectively illustrating each step of a process of making a trench power semiconductor component according to another embodiment of the present disclosure.
Figure 6B:
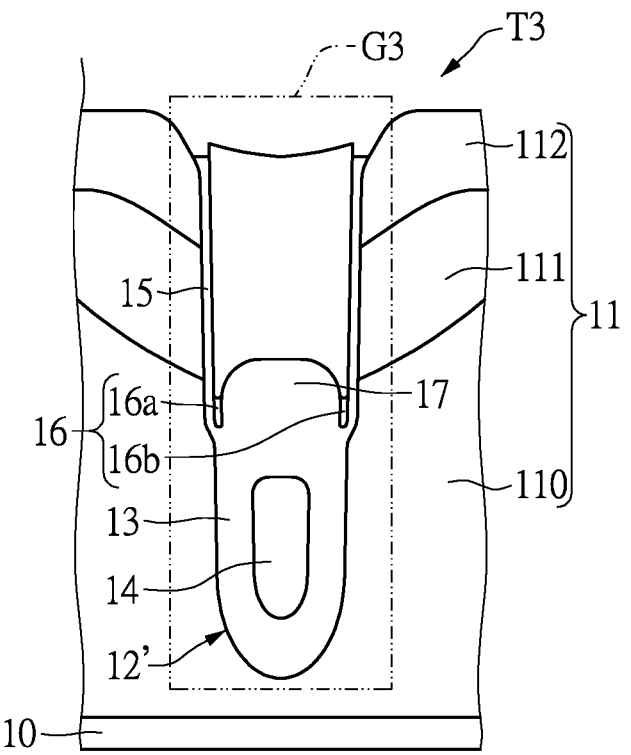

With reference to FIGS. 6A to 6B, in which partial sectional schematic views respectively illustrating each step of a process of making a trench power semiconductor component according to yet another embodiment of the present disclosure are shown.

When performing a thermal oxidation process to form an inter-electrode dielectric layer 17, a trench 12 of a width that is too narrow and a thermal oxide layer L1 located at the opening end of the trench 12 that is too thick will cause the opening of the trench 12 to be filled up, making it difficult to form a gate electrode 18 therein.

To solve the above-mentioned problem, the present disclosure provides a method of making a trench power semiconductor component T3 according to another embodiment. Referring to FIG. 6A, in the present embodiment, the trench 12' has an opening end 12a and a body portion 12b connected thereto. The inner surface of the opening end 12a is a slope extending from the surface of the epitaxial layer 11 towards the body portion 12b. More specifically, the width of the opening end 12a increases along the depth direction of the trench 12'.

In this way, the trench 12' will not be closed by the thermal oxidation layer L1 formed at the opening end 12a of the trench 12' when performing a thermal oxidation process to form the inter-electrode dielectric layer 17.

With reference to FIG. 6B, next, the gate electrode 18 is formed in the trench 12', and then a base region 111 and a source region 112 are respectively formed in the epitaxial layer 11.

More specifically, after the gate electrode 18 is formed in the trench 12', the thermal oxidation layer L1 located on the epitaxial layer 11 and at the opening end 12a will first be removed so as to expose the surface of the epitaxial layer 11.

Moreover, since the inner surface of the opening end 12a is a slope, the doped regions formed by the base region doping process and the source region doping process will have a dopant profile that differs from the previous embodiments. More specifically, the lower edge of the base region 111 and that of the source region 112 incline downward as the slope incline towards the center of the trench gate structure G3.

Referring to FIGS. 7A to 7F, in which partial sectional schematic views respectively illustrating each step of a process of making a trench power semiconductor component according to yet another embodiment of the present disclosure are shown.

Figure 7A:
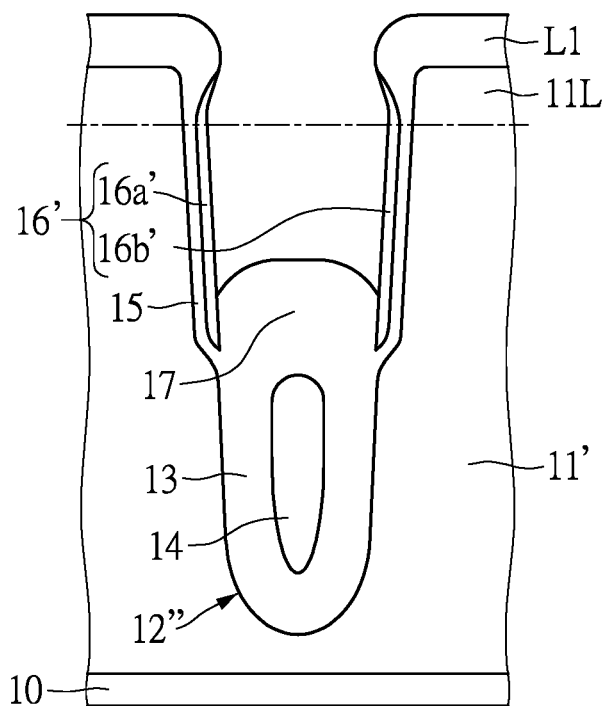
FIGS. 7A to 7F are partial sectional schematic views respectively illustrating each step of a process of making a trench power semiconductor component according to another embodiment of the present disclosure.
Figure 7B:
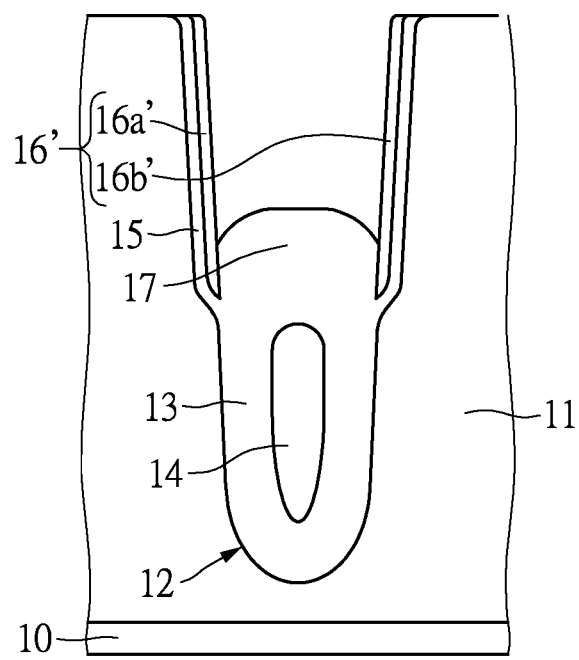

In the embodiment shown in FIGS. 7A and 7B, an epitaxial layer 11' having a larger thickness and a trench 12" with a larger depth are formed. Next, a thermal oxidation layer L1 on the epitaxial layer 11' and a surface 11L of the epitaxial layer 11' are removed, which can be completed by performing a chemical mechanical planarization (CMP) process.

Figure 7C:
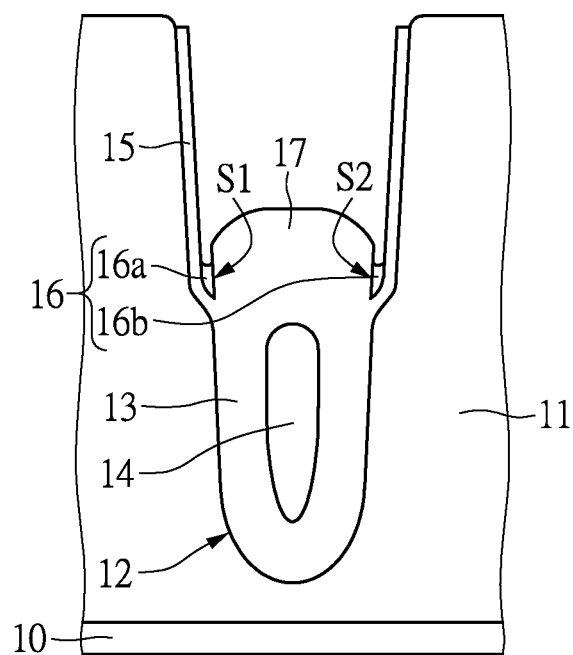

Referring to FIG. 7C, the first wall portion 16a' and the second wall portion 16b' are partially etched. That is to say, a portion of the first wall portion 16a remains in the first slot S1 and a portion of the second wall portion 16b remains in the second slot S2.

Figure 7D:
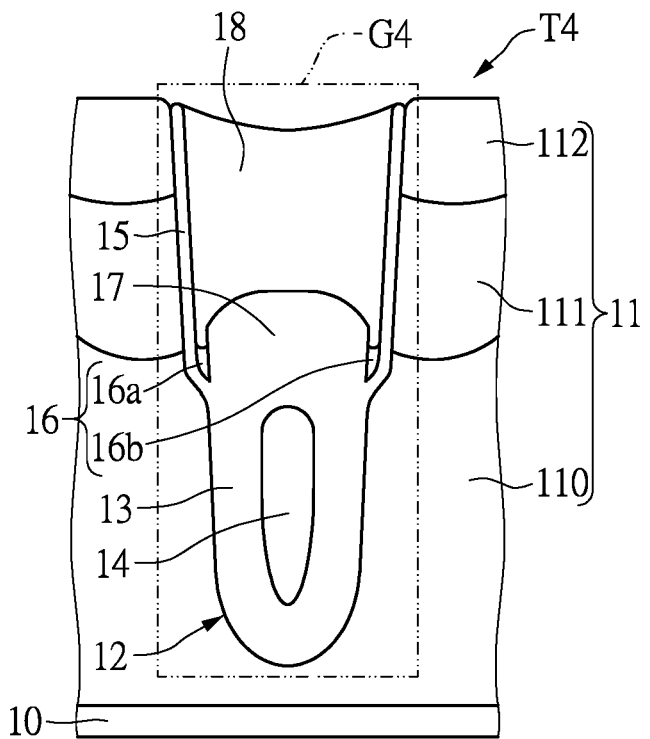

With reference to FIG. 7D, next, a gate electrode 18 is formed in the trench 12 so as to form a trench gate structure G4. Afterwards, a base region 111, a source region 112 and a redistribution layer are respectively formed so as to form the trench power semiconductor component T4 of the present disclosure.

Figure 7E:
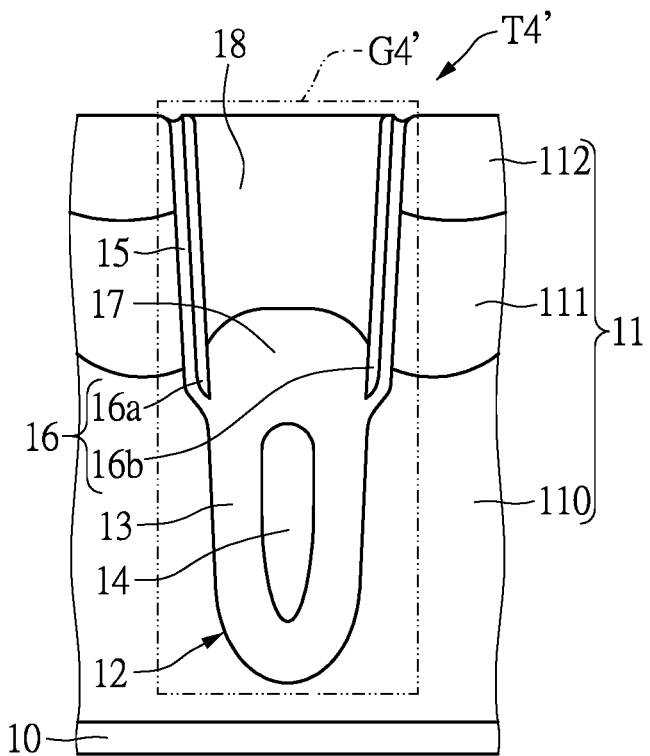

The step of FIG. 7E follows that of FIG. 7B. That is to say, after the thermal oxidation layer L1 on the epitaxial layer 11' and the surface 11L of the epitaxial layer 11' are removed, the first wall portion 16a' and the second wall portion 16b' will not be removed; instead, the gate electrode 18 is directly formed in the trench 12 thereafter so as to form another trench gate structure G4'. Next, the base region 111, the source region 112, and the redistribution layer are formed in sequence so as to form the trench power semiconductor component T4' of the according to the present embodiment of the present disclosure.

Under this condition, the first wall portion 16a' and the second wall portion 16b' of the protection layer 16' together with the upper insulating layer 15 serve as an insulating layer for the gate, thereby reducing leakage current when in operation.

Figure 7F:
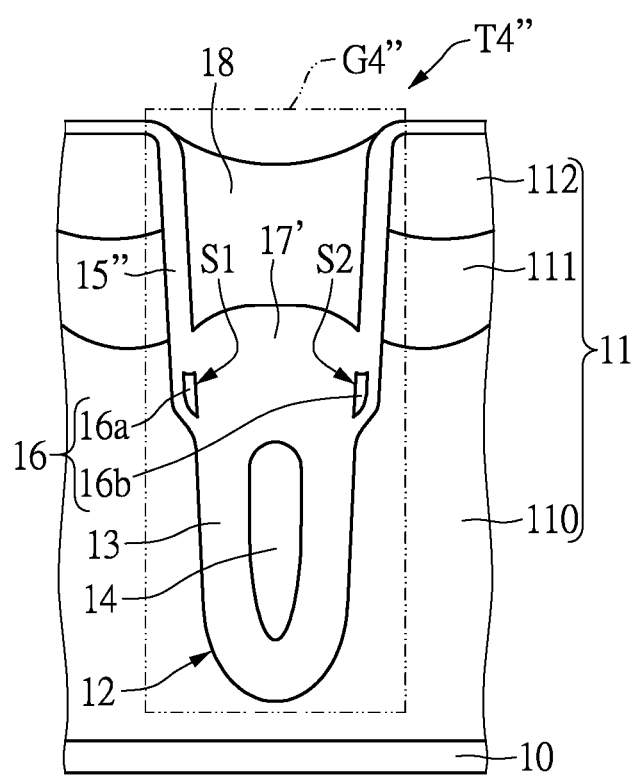

Referring to FIG. 7F, which follows FIG. 7C, after the first wall portion 16a inside the first slot S1 and the second wall portion 16b inside the second slot S2 are formed, a thermal oxidation process is performed so as to thicken the inter-electrode dielectric layer 17' and the upper insulating layer 15", which then cover the first wall portion 16a and the second wall portion 16b respectively. Afterwards, the gate electrode 18, the base region 111 and the source region 112 are respectively formed so as to form the trench power semiconductor component T4" of this embodiment.

More specifically, the first wall portion 16a and the second wall portion 16b of the trench gate structure G4" are separated from the gate electrode 18 by the inter-electrode dielectric layer 17 and the upper insulating layer 15.

Referring to FIGS. 8A to 8D, which illustrate the steps following the steps illustrated in FIG. 2E, a sacrificial insulating layer L2 covering the primary protection layer 16" is formed after forming the primary protection layer 16". The material of the sacrificial insulating layer L2 is different from that of the primary protection layer 16". For instance, the sacrificial insulating layer L2 can be an oxide, and the primary protection layer 16" can be a nitride.

In the present embodiment, the thickness of the primary protection layer 16" does not vary in the depth direction of the trench 12. However, the thickness of the part of the sacrificial insulating layer L2 on the epitaxial layer 11 is larger than that in the trench 12. In one embodiment of the present disclosure, the thickness of the sacrificial insulating layer L2 decreases along the depth direction of the trench 12.

Figure 8A:
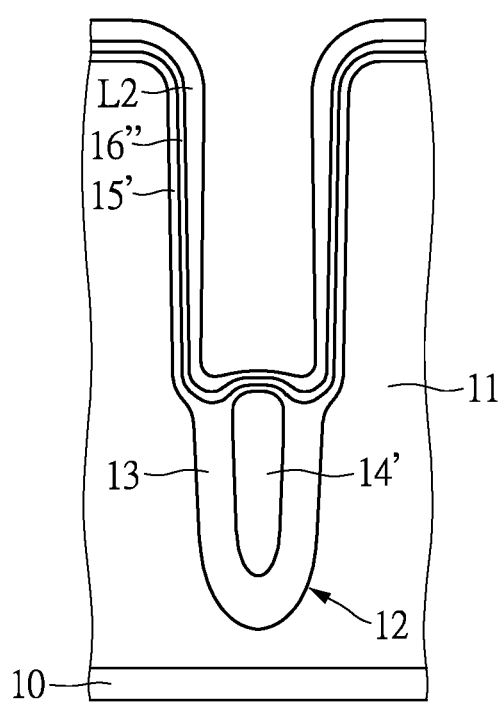
FIGS. 8A to 8D are partial sectional schematic views respectively illustrating each step of a process of making a trench power semiconductor component according to another embodiment of the present disclosure.
Figure 8B:
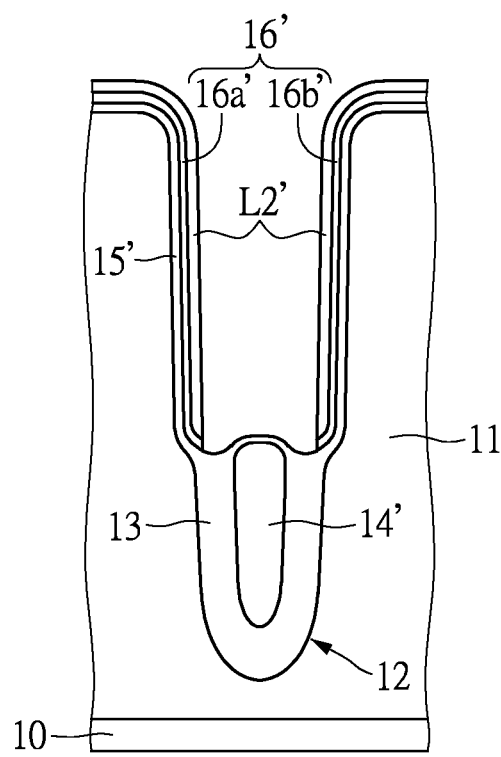

With reference to FIG. 8B, the primary protection layer 16" covering the heavily doped semiconductor material 14' and the sacrificial insulating layer L2 are removed through a dry etching process.

Figure 8C:
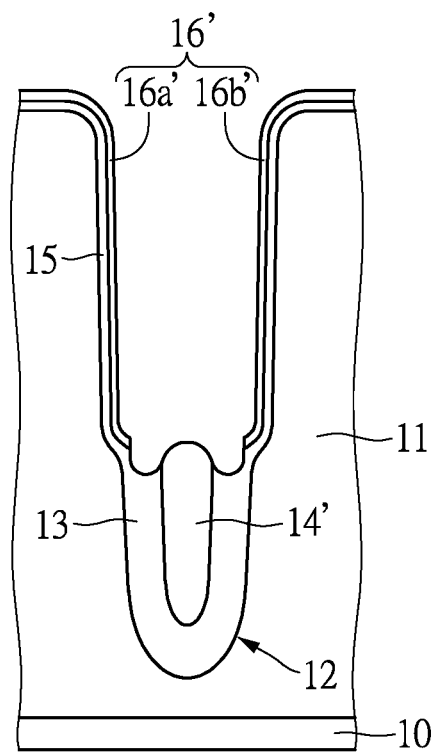

With reference to FIG. 8C, the second insulating layer 15' covering the top of the heavily doped semiconductor material 14' is removed so as to expose the top portion of the heavily doped semiconductor material 14'. In this step, the sacrificial insulating layer L2' is also removed. In the present embodiment, the removal of the second insulating layer 15' and the sacrificial insulating layer L2' can be completed by performing a wet etching process.

It can be seen from FIG. 8C that, with the sacrificial insulating layer L2, the primary protection layer 16" on the surface of the epitaxial layer 11 can be remained after the step of removing the primary protection layer 16" covering the heavily doped semiconductor material 14' is performed.

Figure 8D:
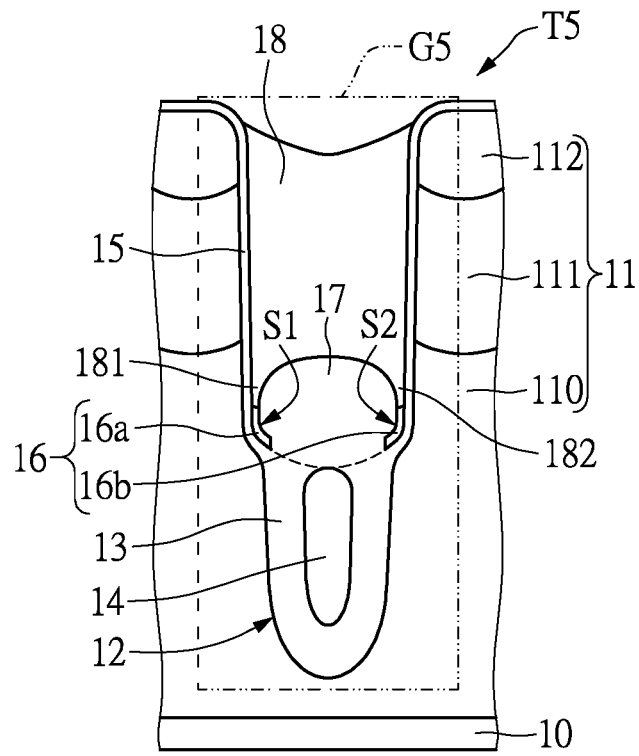

Referring to FIG. 8D, the gate electrode 18, afterwards, the base region 111 and the source region 112 are respectively formed so as to form the trench power semiconductor component T5 of the present embodiment and the trench gate structure G5 thereof. In the present embodiment, the first wall portion 16a and a portion of the gate electrode 18 fill the first slot S1, and the second wall portion 16b together with a portion of the gate electrode 18 fill the second slot S2. The first wall portion 16a and the second wall portion 16b each have a bending portion (without reference number) at the bottom thereof.

In another embodiment, the first wall portion extends from the opening end of the trench 12 into the first slot S1, and the second side wall portion extends from the opening end of the trench 12 into the second slot S2.

Figure 9B:
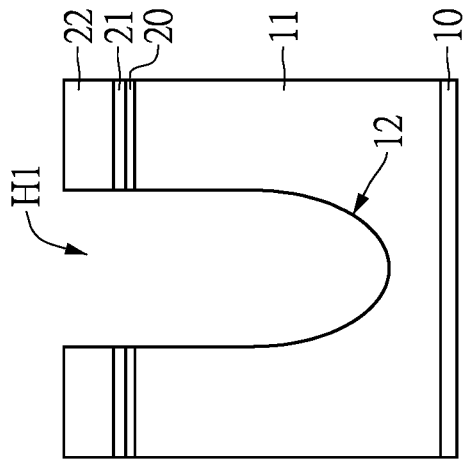
FIGS. 9A to 9N are partial sectional schematic views respectively illustrating each step of a process of making a trench power semiconductor component according to another embodiment of the present disclosure.
Figure 9D:
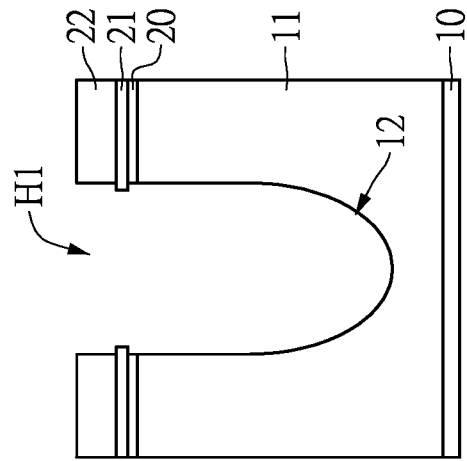
Figure 9A:
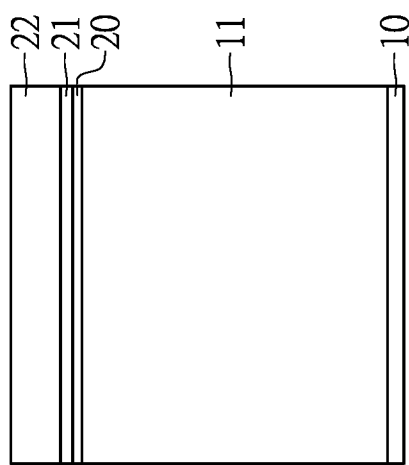

With reference to FIG. 9A, a pad oxide layer 20, a protection oxide layer 21, and a hard layer 22 are respectively formed on the epitaxial layer 11. The material of the protection oxide layer 21 is different from that of the pad oxide layer 20. The material of the protection oxide layer 21 can be a nitride, e.g. silicon nitride, which protects the epitaxial layer 11 from being oxidized in the follow-up thermal oxidation process.

Next, referring to FIG. 9B, a trench 12 is formed in the epitaxial layer 11. In the step of forming the epitaxial layer 11 in the trench 12, an opening H1 communicating with the trench 12 is formed in the hard layer 22 and the protection oxide layer 21.

Figure 9C:
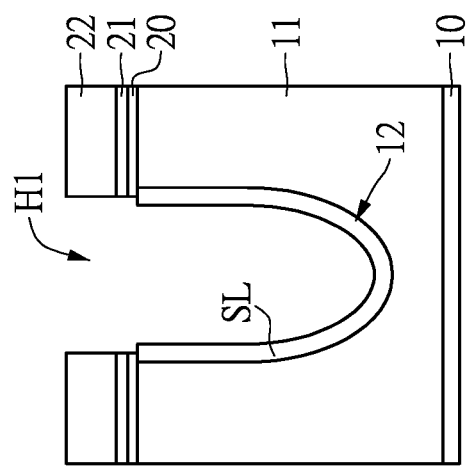

With further reference to FIG. 9C, in the present embodiment, a sacrificial oxide layer SL is formed on the inner wall surface of the trench 12 after the trench is formed in the epitaxial layer 11. The sacrificial oxide layer SL can be formed by performing a thermal oxidation layer on the inner wall surface of the trench 12.

Next, referring to FIG. 9D, the sacrificial oxide layer SL, a part of the pad oxide layer 20 and a part of the hard layer 22 are removed such that the end portion of the protection oxide layer 21 protrudes from the two opposite inner surfaces of the opening H1.

Figure 9E:
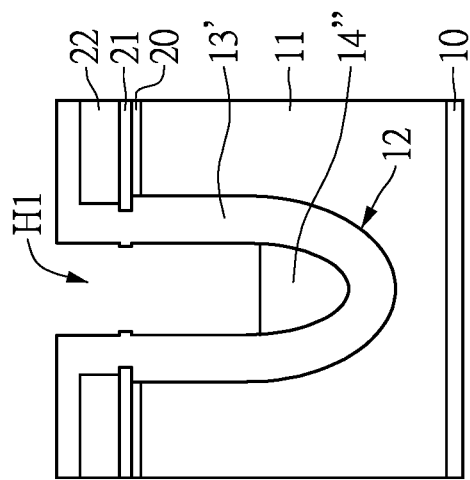

Referring to FIG. 9E, a first insulating layer 13' is formed on the inner wall surface of the trench 12 and has a contour that roughly matches that of the inner wall surface of the trench 12. The first insulating layer 13' of the present disclosure has a larger thickness compared with that of the embodiment shown in FIG. 2A.

Figure 9F:
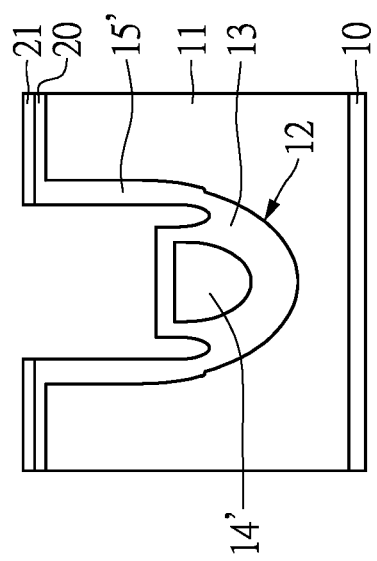
Figure 9G:
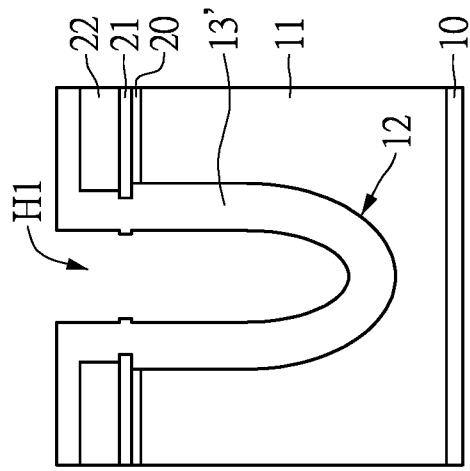

With reference to FIG. 9F, a heavily doped semiconductor material 14" is formed in the lower half part of the trench 12. Next, as shown in FIG. 9G, the first insulating layer 13' in the upper half part of the trench 12 is removed, consequently forming the bottom insulating layer 13 in the lower half part thereof. The bottom insulating layer 13 covers the lower inner surface of the trench 12, and the top portion of the heavily doped semiconductor material 14" protrudes from the top surface of the bottom insulating layer 13.

Moreover, in the present embodiment, the material of the hard layer 22 and that of the first insulating layer 13' are the same. For example, the material of the hard layer 22 and the first insulating layer 13' can be silicon oxide. In this way, when removing the first insulating layer 13' in the upper half portion of the trench 12 and on the epitaxial layer 11, the hard layer 22 can be removed together with the first insulating layer 13'.

Figure 9H:
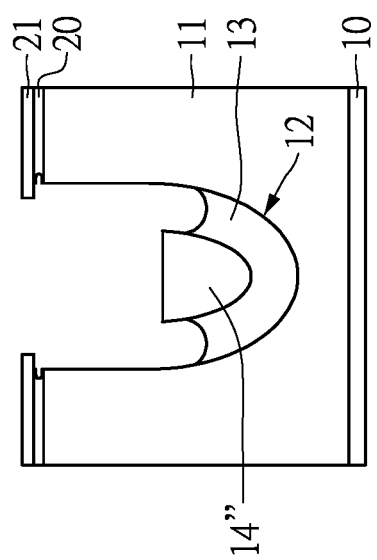

Next, referring to FIG. 9H, a second insulating layer 15' covering the upper inner wall surface of the trench 12, the bottom insulating layer 13, and the heavily doped semiconductor material 14' is formed by performing a thermal oxidation process. In this embodiment, the upper half part of the trench 12 has a width larger than that of the lower half part of the trench 12. Moreover, referring to FIG. 9H, since the surface of the epitaxial layer 11 is covered by the pad oxide layer 20 and the protection oxide layer 21, the surface of the epitaxial layer 11 will not be further oxidized.

Figure 9I:
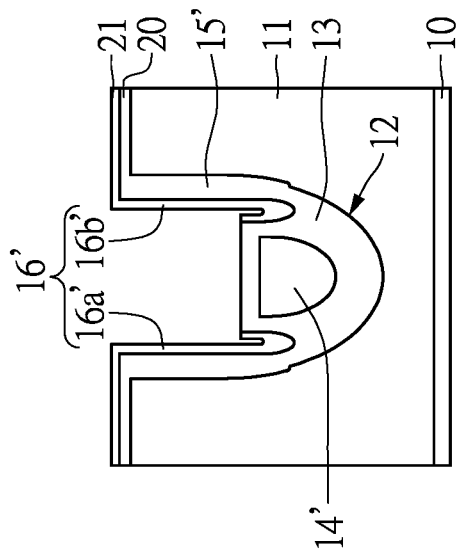

With reference to FIG. 9I, a primary protection layer 16" covering the second insulating layer 15' is formed. The material of the primary protection layer 16" is different from that of the second insulating layer 15' but the same as that of the protection oxide layer 21.

Figure 9J:
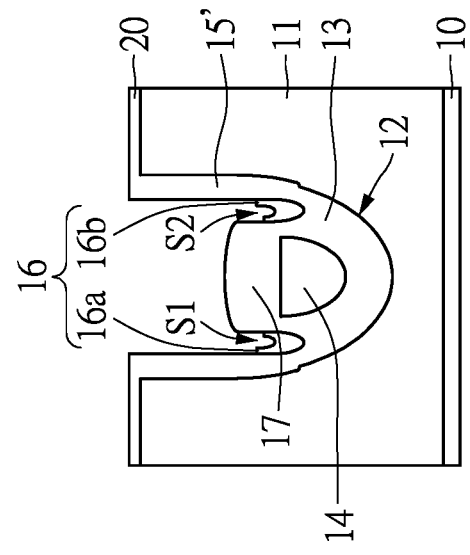

With reference to FIG. 9J, a part of the primary protection layer 16" covering the heavily doped semiconductor material 14' is removed so as to form the protection layer 16'. The protection layer 16' includes at least the first wall portion 16a' and the second wall portion 16b' respectively covering the two opposite side wall surfaces of the upper insulating layer 15.

In the present embodiment, the second insulating layer 15' covering the heavily doped semiconductor material 14' is not removed. Furthermore, the protection oxide layer 21 on the epitaxial layer 11 is not removed when removing the primary protection layer 16" covering the heavily doped semiconductor material 14' through a dry etching process.

Figure 9K:
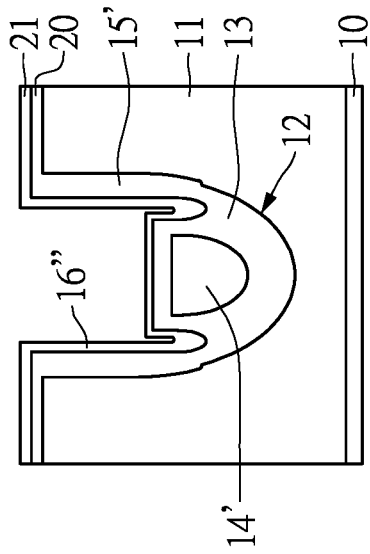

With reference to FIG. 9K, the top portion of the heavily doped semiconductor material 14' is oxidized by performing a thermal oxidation process so as to form an inter-electrode dielectric layer 17. Furthermore, the part of the heavily doped semiconductor material 14' that is not oxidized forms a shielding electrode 14.

Since the protection layer 16' protecting the two side walls of the trench 12 and the protection oxide layer 21 protecting the epitaxial layer 11 are formed before the thermal oxidation process, the two side walls of the trench 12 and surface of the epitaxial layer 11 will not be oxidized during the thermal oxidation process.

With reference to FIG. 9K, the upper insulating layer 15, the inter-electrode dielectric layer 17, and the bottom insulating layer 13 jointly define a first slot S1 and a second slot S2 respectively located on either side of the inter-electrode dielectric layer 17. The bottom portion of the first wall portion 16a' fills the first slot S1, and the bottom portion of the second wall portion 16b' fills the second slot S2. A cross section of the first slot S1 and that of the second slot S2 are in hook shape.

Figure 9L:
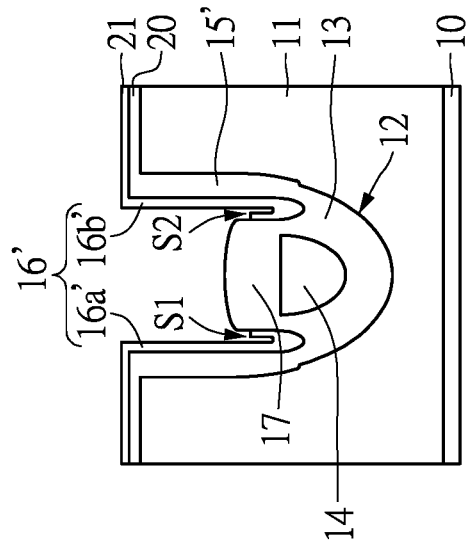

Referring to FIG. 9L, a portion of the first wall portion 16a' and a portion of the second wall portion 16b' are removed, and the protection oxide layer 21 on the surface of the epitaxial layer 11 is simultaneously removed.

The remaining part of the first wall portion 16a fills a part of the first slot S1, and the remaining part of the second wall portion 16b fills a part of the second slot S2. A cross section of the first wall portion 16a and that of the second wall portion 16b are both in a hook shape. The bottom end of the first wall portion 16a and that of the second wall portion 16b are at a lower level than the top end of the shielding electrode 14.

Figure 9N:
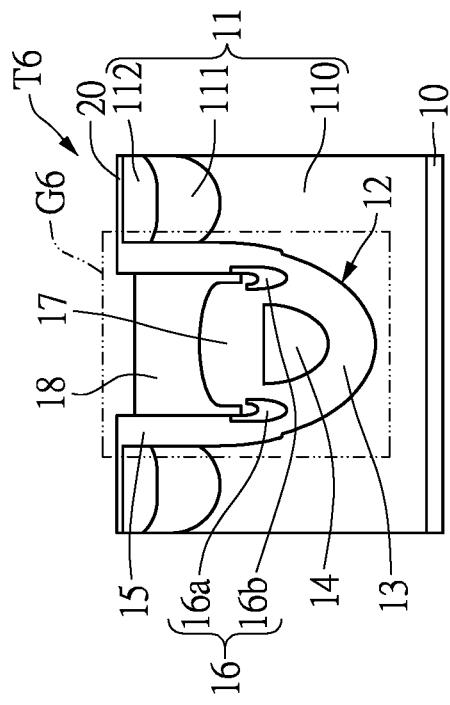
Figure 9M:
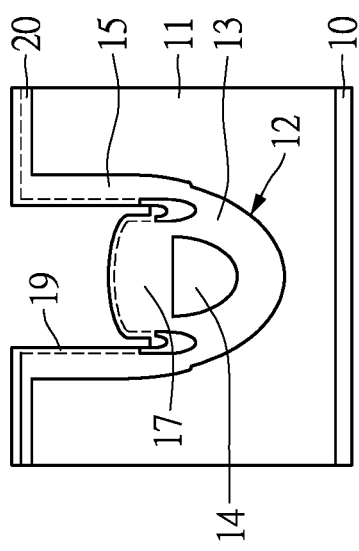

In addition, when performing the steps illustrated in FIGS. 9A to 9L in which the thickness of the upper insulating layer 15 is lower than expected, a second upper insulating layer 19 covering the upper insulating layer 15 on the upper inner wall surface of the trench 12 can be formed, as shown in FIG. 9M. The material of the second upper insulating layer 19 can be the same as that of the upper insulating layer 15.

Referring to FIG. 9N, a gate electrode 18 is formed in the upper half part of the trench 12 so as to form a trench gate structure G6. The gate electrode 18 is separated from the shielding electrode 14 by the inter-electrode dielectric layer 17. Afterwards, the base region 111, the source region 112 and the redistribution layer are formed so as to form the trench power semiconductor component T6 of the present embodiment.

Figure 10B:
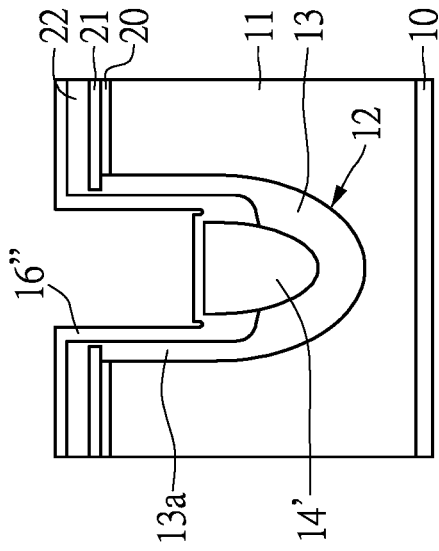
Figure 10A:
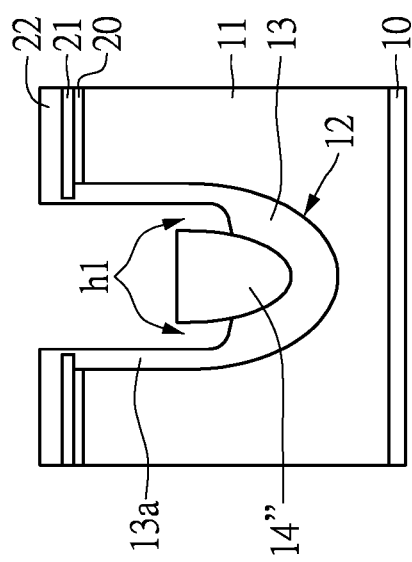

Referring to FIGS. 10A to 10H, the steps following those illustrated in FIG. 9F are shown. That is to say, the first insulating layer 13' and the heavily doped semiconductor material 14" have already been formed in the trench 12, and the pad oxide layer 20, the protection oxide layer 21, and the hard layer 22 have already been formed on the epitaxial layer 11 before the step of FIG. 10A is performed.

With reference to FIG. 10A, the first insulating layer 13' on the upper inner wall surface of the trench 12 is removed such that the top portion of the heavily doped semiconductor material 14" is exposed. In other words, unlike in the step of FIG. 9G, the first insulating layer 13a in the upper half part of the trench 12 is remained in FIG. 10A.

The first insulating layer remained in the lower half part of the trench 12 is the bottom insulating layer 13. Moreover, the first insulating layer 13a remained in the upper half part of the trench 12, the bottom insulating layer 13, and the heavily doped semiconductor material 14' jointly define two recesses h1 respectively situated on either side of the heavily doped semiconductor material 14'.

Next, with reference to FIG. 10B, a primary protection layer 16" covering the surface of the epitaxial layer 11, the first insulating layer 13a, the bottom insulating layer 13 and the heavily doped semiconductor material 14' is formed, in which a part of the primary protection layer 16" fills the recesses h1. Next, as shown in FIG. 10C, a part of the primary protection layer 16" covering the heavily doped semiconductor material 14' is removed so as to expose the top portion of the heavily doped semiconductor material 14".

Similar to the previous embodiments, the protection layer 16' having a first wall portion 16a' and a second wall portion 16b' is formed after the part of the primary protection layer 16" covering the heavily doped semiconductor material 14' is removed. Furthermore, the top surface of the heavily doped semiconductor material 14' and a portion of the side surfaces thereof are exposed so as to increase the area to be oxidized in the follow-up steps.

Referring to FIG. 10D, the top portion of the heavily doped semiconductor material 14" is oxidized and forms the inter-electrode dielectric layer 17. Moreover, the part of the heavily doped semiconductor material 14" that is not oxidized forms the shielding electrode 14. Furthermore, the surface of the epitaxial layer 11 is covered by the hard layer 22, the protection oxide layer 21 and the pad oxide layer 20 and thus will not be oxidized when forming the inter-electrode dielectric layer 17.

With reference to FIG. 10E, the first wall portion 16a' and the second wall portion 16b' in the upper half part of the trench 12 are removed. Compared with the first wall portion 16a' and the second wall portion 16b' in FIGS. 9A to 9N, a cross section of which is in a hook shape, the first wall portion 16a' and the second wall portion 16b' in FIG. 10E each have a cross section in a strip shape.

Referring to FIG. 10F, the first insulating layer 13a in the upper half part of the trench 12, and the hard layer 22, the pad oxide layer 20, and the protection oxide layer 21 on the epitaxial layer 11 are removed. The hard layer 22 on the epitaxial layer 11 is simultaneously removed when removing the first insulating layer 13a. Afterwards, the pad oxide layer 20 and the protection oxide layer 21 on the epitaxial layer 11 can be removed by a chemical mechanical planarization process or any other known etching methods.

Figure 10H:
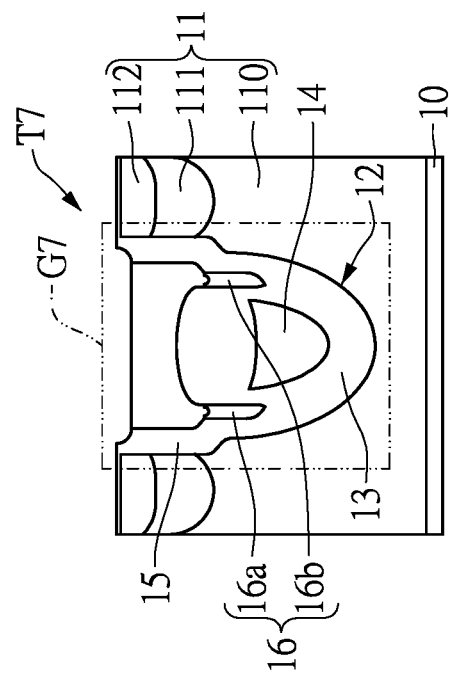
Figure 10G:
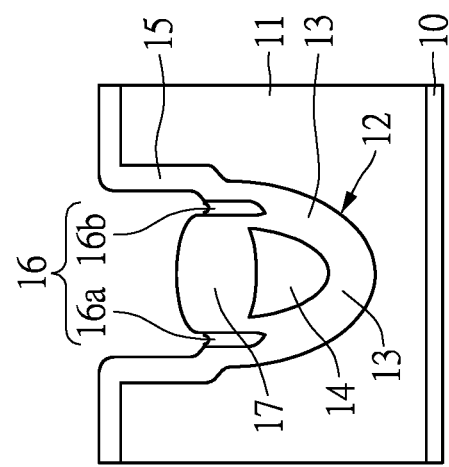

Referring to FIG. 10G, the upper insulating layer 15 is formed in the upper inner wall surface of the trench 12. In the present embodiment, the upper insulating layer 15 can be formed by a thermal oxidation process oxidizing the upper inner wall surface of the exposed trench 12.

It should be noted that, in the present embodiment, the bottom insulating layer 13, the shielding electrode 14, the inter-electrode dielectric layer 17, and the protection layer 16 are first formed before forming the upper insulating layer 15. That is to say, the step of forming the upper insulating layer 15 is performed after the inter-electrode dielectric layer 17 is formed.

Referring to FIG. 10H, the gate electrode 18 is formed in the trench 12 so as to form the trench gate structure G7. Next, the base region 111, the source region 112 and the redistribution layer are respectively formed so as to form the trench power semiconductor component T7 of the present disclosure.

In summary, the present disclosure provides the trench power semiconductor components T1, T1', T2, T2', T3, T4, T4', T4", T5, T6, T7 and the methods of making the same, in which a protection layer 16' covering the two side walls of the trench 12 is formed before the formation of the inter-electrode dielectric layer 17 so that the two side walls of the trench 12 can be prevented from being oxidized during the step of forming the inter-electrode dielectric layer 17, which causes a change in the width of the trench 12.

Furthermore, in the method of forming a trench power semiconductor component according to the embodiments of the present disclosure, the protection layer 16 and the protection layer 16' are formed after the bottom insulating layer 13 covering the shielding electrode 14 is formed. Consequently, the bottom end of the first wall portion 16a and the first wall portion 16a' and that of the second wall portion 16b and the second wall portion 16b' are closer to the top end of the shielding electrode 14 than to the bottom end thereof.

Through the above mentioned technical solution, when a reverse bias voltage is applied to the trench power semiconductor components T1, T1', T2, T2', T3, T4, T4', T4", T5, T6, T7, the bottom of the trench 12 will have a loose distribution of electric field due to simple materials beneath the shielding electrode 14, thereby increasing the breakdown voltage without adversely affecting the on-resistance. When the breakdown voltage is increased, the doping concentration of the drift region 110 can be further optimized so as to reduce the on-resistance, thereby enhancing the switching efficiency of the trench power semiconductor components T1, T1', T2, T2', T3, T4, T4', T4", T5, T6, T7. Based on simulations, it has been proven that the trench power semiconductor components T1, T1', T2, T2', T3, T4, T4', T4", T5, T6, T7 according to the embodiments of the present disclosure have smaller distribution densities and thus higher breakdown voltages. Therefore, the trench power semiconductor components T1, T1', T2, T2', T3, T4, T4', T4", T5, T6, T7 according to the embodiments of the present disclosure can decrease the on-resistance by 50%.

In the trench power semiconductor components T1, T1', T2, T2', T3, T4, T4', T4", T5, T6, T7, the first wall portion 16a, and the first wall portion 16a' fill the first slot S1, and the second wall portion 16b together with the second wall portion 16b' fill the second slot S2, which decreases the gate-to-drain capacitance.

Furthermore, according to the method of making a trench power semiconductor component of the present disclosure, a protection oxide layer 21 is formed on the surface of the epitaxial layer 11 so as to prevent the surface of the epitaxial layer 11 from being oxidized during the follow-up thermal oxidation processes.

The description illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A trench power semiconductor component, comprising:
a substrate;
an epitaxial layer disposed on the substrate, the epitaxial layer having at least one trench formed therein; and
a trench gate structure located in the at least one trench, wherein the trench gate structure includes:
 a bottom insulating layer covering a lower inner wall of the at least one trench;
 a shielding electrode located in the lower half part of the at least one trench, the shielding electrode and the epitaxial layer being separated from each other by the bottom insulating layer;
 a gate electrode disposed on the shielding electrode;
 an inter-electrode dielectric layer disposed between the gate electrode and the shielding electrode;
 an upper insulating layer covering an upper inner wall of the at least one trench, wherein the upper insulating layer, the bottom insulating layer, and the inter-electrode dielectric layer jointly define a first slit and a second slit, one located on either side of the inter-electrode dielectric layer; and
 a protection structure including a first wall portion and a second wall portion, wherein the first wall portion fills at least one portion of the first slit and the second wall portion fills at least one portion of the second slit, wherein the first wall portion extends from an opening end of the trench into the first slit, and the second wall portion extends from the opening end of the trench into second slit
 wherein a bottom tip of the first wall portion and a bottom tip of the second wall portion are higher than or at the same level as a top end of the shielding electrode.

2. The trench power semiconductor component according to claim 1, wherein the gate electrode includes a first extension portion and a second extension portion respectively located in the first slit and the second slit.

3. The trench power semiconductor component according to claim 1, wherein the first wall portion and the second wall portion are separated from the gate electrode by the inter-electrode dielectric layer and the upper insulating layer.

4. The trench power semiconductor component according to claim 1, further comprising a base region and a source region disposed above the base region, wherein an edge of the base region and an edge of the source region are inclined downward.

5. A trench power semiconductor component, comprising:
a substrate;
an epitaxial layer disposed on the substrate, the epitaxial layer having at least one trench formed therein; and
a trench gate structure located in the at least one trench, wherein the trench gate structure includes:
 a bottom insulating layer covering a lower inner wall of the at least one trench;
 a shielding electrode located in the lower half part of the at least one trench, the shielding electrode and the epitaxial layer being separated from each other by the bottom insulating layer;
 a gate electrode disposed on the shielding electrode;
 an inter-electrode dielectric layer disposed between the gate electrode and the shielding electrode;
 an upper insulating layer covering an upper inner wall of the at least one trench, wherein the upper insulating layer, the bottom insulating layer, and the inter-electrode dielectric layer jointly define a first slit and a second slit, one located on either side of the inter-electrode dielectric layer; and
 a protection structure including a first wall portion and a second wall portion, wherein the first wall portion fills at least one portion of the first slit and the second wall portion fills at least one portion of the second slit,
 wherein the first wall portion of the trench extends from an opening end of the trench into the first slit, and the second side wall portion of the trench extends from the opening end of the trench into the second slit.

6. A trench power semiconductor component, comprising:
a substrate;
an epitaxial layer disposed on the substrate, the epitaxial layer having at least one trench formed therein; and a trench gate structure located in the at least one trench, wherein the trench gate structure includes:
- a bottom insulating layer covering a lower inner wall of the at least one trench;
- a shielding electrode located in the lower half part of the at least one trench, the shielding electrode and the epitaxial layer being separated from each other by the bottom insulating layer;
- a gate electrode disposed on the shielding electrode;
- an inter-electrode dielectric layer disposed between the gate electrode and the shielding electrode;
- an upper insulating layer covering an upper inner wall of the at least one trench, wherein the upper insulating layer, the bottom insulating layer, and the inter-electrode dielectric layer jointly define a first slit and a second slit, one located on either side of the inter-electrode dielectric layer; and
- a protection structure including a first wall portion and a second wall portion, wherein the first wall portion fills at least one portion of the first slit and the second wall portion fills at least one portion of the second slit, wherein the gate electrode includes a first extension portion and a second extension portion respectively located in the first slit and the second slit.

7. The trench power semiconductor component according to claim 6, wherein the first wall portion and the second wall portion respectively have two bottom portions that are bent toward each other.

8. The trench power semiconductor component according to claim 1, wherein sectional outlines of the first wall portion and the second wall portion are both hooked shaped.

* * * * *